US006567489B1

(12) United States Patent
Glover

(10) Patent No.: US 6,567,489 B1
(45) Date of Patent: May 20, 2003

(54) METHOD AND CIRCUITRY FOR ACQUIRING A SIGNAL IN A READ CHANNEL

(75) Inventor: Kerry C. Glover, Wylie, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/246,408

(22) Filed: Feb. 8, 1999

(51) Int. Cl.$^7$ ............................ H03D 3/24; H04L 27/08; H03H 7/40
(52) U.S. Cl. ........................ 375/376; 375/345; 375/229
(58) Field of Search ................................ 375/372, 376, 375/345, 355, 362–366, 369, 229; 360/51, 39; 369/59.1, 59.19

(56) References Cited

U.S. PATENT DOCUMENTS 5,258,933 A * 11/1993 Johnson et al. ............... 360/46
5,341,249 A    8/1994 Abbott et al. ................. 360/46
5,552,942 A * 9/1996 Ziperovich et al. ........... 360/51

(List continued on next page.)

OTHER PUBLICATIONS

H. Kobayashi and D. T. Tang, "Application of Partial–response Channel Coding to Magnetic Recording Systems," *IBM J. Res. Develop.*, Jul. 1970, pp. 368–375.
Kenneth Abend and Bruce D. Fritchman, "Statistical Detection for Communication Channels with Intersymbol Interference," *Proceedings of the IEEE*, vol. 58, No. 5, May 1970, pp. 779–785.
G. David Forney, Jr., "Maximum–Likelihood Sequence Estimation of Digital Sequences in the Presence of Intersymbol Interference," *IEEE Transactions on Information Theory*, vol. IT–18, No. 3, May 1972, pp. 363–378.

G. David Forney, Jr., "The Viterbi Algorithm," *Proceedings of the IEEE*, vol. 61, No. 3, Mar. 1973, pp. 268–278.
Gottfried Ungerboeck, "Adaptive Maximum–Likelihood Receiver for Carrier–Modulated Data–Transmission Systems," *IEEE Transactions on Communications*, vol. COM–22, No. 5, May 1974, pp. 624–636.
Peter Kabal and Subbarayan Pasupathy, "Partial–Response Signaling," *IEEE Transactions on Communications*, vol. COM–23, No. 9, Sep., 1975, pp. 921–934.
C.T. Beare, "The Choice of the Desired Impulse Response in Combined Linear–Viterbi Algorithm Equalizers," *IEEE Transactions on Communications*, vol. COM–26, No. 8, Aug. 1978, pp. 1301–1307.
R.A. Baugh, E.S. Murdock, B.R. Natarajan, "Measurement of Noise in Magnetic Media," *IEEE*, 1983, pp. 1722–1724.
Hans Burkhardt and Lineu C. Barbosa, "Contributions to the Application of the Viterbi Algorithm," *IEEE Transactions on Information Theory*, vol. IT–31, No. 5, Sep. 1985, pp. 626–634.
Yaw–Shing Tang, "Noise Autocorrelation in Magnetic Recording Systems," *IEEE Transactions on Magnetics*, vol. MAG–21, No. 5, Sep. 1985, pp. 1389–1394.
Roger W. Wood and David A. Petersen, "Viterbi Detection of Class IV Partial Response on a Magnetic Recording Channel," *IEEE Transactions on Communications*, vol. COM–34, No. 5, May 1986, pp. 454–461.

(List continued on next page.)

*Primary Examiner*—Tesfaldet Bocure
(74) *Attorney, Agent, or Firm*—W. Daniel Swayze, Jr.; W. James Brady; Frederick J. Telecky, Jr.

(57) ABSTRACT

A method for acquiring a signal in a read channel (18), the read channel (18) having an equalizer (48), includes performing an automatic gain control sequence; performing a phase locked loop sequence that includes performing a fast phase locked loop step, the fast phase locked loop step including bypassing the equalizer; and performing a synchronization search sequence.

17 Claims, 3 Drawing Sheets

U.S. PATENT DOCUMENTS

| | | | | | |
|---|---|---|---|---|---|
| 5,808,573 | A | * | 9/1998 | Shih et al. | 341/110 |
| 5,905,601 | A | * | 5/1999 | Tsunoda | 360/51 |
| 6,101,054 | A | * | 8/2000 | Tsunoda | 360/25 |
| 6,108,153 | A | * | 8/2000 | Glover | 360/51 |
| 6,282,045 | B1 | * | 8/2001 | Glover | 360/73.03 |
| 6,282,253 | B1 | * | 8/2001 | Fahrenbruch | 327/156 |
| 6,404,577 | B1 | * | 6/2002 | Sobey | 360/49 |

OTHER PUBLICATIONS

Yaw–Shing Tang, "Noise Autocorrelation in High Density Recording on Metal Film Disks," *IEEE Transactions on Magnetics*, vol. MAG–22, No. 5, Sep. 1986, pp. 883–885.

C. Michael Melas, Patrick Arnett, Irene Beardsley, Dean Palmer "Nonlinear Superposition in Saturation Recording of Disk Media," *IEEE Transactions on Magnetics*, vol. MAG–23, No. 5, Sep. 1987, pp. 2079–2081.

Dean Palmer, Pablo Ziperovich, Roger Wood, Thomas D. Howell, "Identification of Nonlinear Write Effects Using Pseudorandom Sequences," *IEEE Transactions on Magnetics*, vol. MAG–23, No. 5, Sep. 1987, pp. 2377–2379.

Roger Wood, "Jitter vs. Additive Noise in Magnetic Recording: Effects on Detection," *IEEE Transactions on Magnetics*, vol. MAG–23, No. 5, Sep. 1987, pp. 2683–2685.

H.K. Thapar and A.M. Patel, "A Class of Partial Response Systems for Increasing Storage Density in Magnetic Recording," *IEEE Transactions on Magnetics*, vol. MAG–23, No. 5, Sep. 1987, pp. 3666–3668.

Yinyi Lin and Jack K. Wolf, "Combined ECC/RLL Codes," *IEEE Transactions on Magnetics*, vol. 24, No. 6, Nov. 1988, pp. 2527–2529.

Catherine A. French, Anthony D. Weathers, and Jack Keil Wolf, "A Generalized Scheme for Generating and Detecting Recording Channel Output Waveforms with Controlled Pulse Polarity," *IEEE Transactions on Magnetics*, vol. 24, No. 6, Nov. 1988, pp. 2530–2532.

Richard C. Schneider, "Write Equalization for Generalized (d,k) Codes," *IEEE Transactions on Magnetics*, vol. 24, No. 6, Nov. 1988, pp. 2533–2535.

Michael Melas, Patrick Arnett, Jaekyun Moon, "Noise in a Thin Metallic Medium: The Connection with Nonlinear Behaviour," *IEEE Transactions on Magnetics*, vol. 24, No. 6, Nov. 1988, pp. 2712–2714.

Jaekyun J. Moon and L. Richard Carley, "Partial Response Signaling in a Magnetic Recording Channel," *IEEE Transactions on Magnetics*, vol. 24, No. 6, Nov. 1988, pp. 2973–2975.

F. Dolivo, R. Hermann, and S. Olcer, "Performance and Sensitivity Analysis of Maximum–Likelihood Sequence Detection on Magnetic Recording Channels," *IEEE Transactions on Magnetics*, vol. 25, No. 5, Sep. 1989, pp. 4072–4074.

Roger Wood, "New Detector for 1,k Codes Equalized to Class II Partial Response," *IEEE Transactions on Magnetics*, vol. 25, No. 5, Sep. 1989, pp. 4075–4077.

J.W.M. Bergmans, S. Mita, M. Izumita, "Characterization of Digital Recording Channels By Means of Echo Cancellation Techniques," *IEEE Transactions on Magnetics*, vol. 25, No. 5, Sep. 1989, pp. 4078–4080.

Yinyi Lin and Roger Wood, "An Estimation Technique for Accurately Modelling the Magnetic Recording Channel Including Nonlinearities," *IEEE Transactions on Magnetics*, vol. 25, No. 5, Sep. 1989, pp. 4084–4086.

Anthony D. Weathers, Catherine A. French, Jack Keil Wolf, "Results on 'Controlled Polarity' Modulation and Coding," *IEEE Transactions on Magnetics*, vol. 25, No. 5, Sep. 1989, pp. 4090–4092.

Catherine A. French, "Distance Preserving Run–Length Limited Codes," *IEEE Transactions on Magnetics*, vol. 25, No. 5, Sep. 1989, pp. 4093–4095.

Lyle J. Fredrickson and Jack Keil Wolf, "Error Detecting Multiple Block, (d,k) Codes," *IEEE Transactions on Magnetics*, vol. 25, No. 5, Sep. 1989, pp. 4096–4098.

Roger Wood, "Enhanced Decision Feedback Equalization," *IEEE Transactions on Magnetics*, vol. 26, No. 5, Sep. 1990, pp. 2178–2180.

Thomas D. Howell, Donald P. McCown, Thomas A. Diola, Yaw–shing Tang, Karl R. Hese, Ralph I. Gee, "Error Rate Performance of Experimental Gigabit Per Square Inch Rcording Components," *IEEE Transactions on Magnetics*, vol. 26, No. 5, Sep. 1990, pp. 2298–2302.

Pantas Sutardja, "A Post–Compensation Scheme for Peak–Detect Channel," *IEEE Transactions on Magnetics*, vol. 26, No. 5, Sep. 1990, pp. 2303–2305.

L.L. Nunnelley, M.A. Burleson, L.L. Williams, I.A. Beardsley, "Analysis of Asymmetric Deterministic Bitshift Errors in a Hard Disk File," *IEEE Transactions on Magnetics*, vol. 26, No. 5 Sep. 1990, pp. 2306–2308.

H.K. Thaper, N.P. Sands, W.L. Abbott, J.M. Cloffi, "Spectral Shaping for Peak Detection Equalization," *IEEE Transactions on Magnetics*, vol. 26, No. 5 Sep. 1990, pp. 2309–2311.

Lyle J. Fredricskon, "Coding for Maximum Likelihood Detection on a Magnetic Recording Channel," *IEEE Transactions on Magnetics*, vol. 26, No. 5 Sep. 1990, pp. 2315–2317.

Lyle J. Fredrickson, "A (D,K,C)=(0,3,5/2) Rate 8/10 Modulation Code," *IEEE Transactions on Magnetics*, vol. 26, No. 5 Sep. 1990, pp. 2318–2320.

R. Hermann, "Volterra Modeling of Digital Magnetic Saturation Recording Channels," *IEEE Transactions on Magnetics*, vol. 26, No. 5 Sep. 1990, pp. 2125–2127.

Roger Wood, Mason Williams, John Hong, "Considerations for High Data Rate Recording with Thin–Film Heads," *IEEE Transactions on Magnetics*, vol. 26, No. 6, Nov. 1990, pp. 2954–2959.

Jaekyun Moon and L. Richard Carley, "Performance Comparison of Detection Methods in Magnetic Recoriding," *IEEE Transactions on Magnetics*, vol. 26, No. 6, Nov. 1990, pp. 3155–3172.

William L. Abbott, John M. Cioffi, Hemant K. Thapar, "Performance of Digital Magnetic Recording with Equalization and Offtrack Interference, " *IEEE Transactions on Magnetics*, vol. 27, No. 1, Jan. 1991, pp. 705–716.

Jan. W.M. Bergmans, Seiichi Mita, Morishi Izumita, "A Simulation Study of Adaptive Reception Schemes for High –Density Digital Magnetic Storage," *IEEE Transaction on Magnetics*, vol. 27, No. 1, Jan. 1991, pp. 717–723.

Ching Tsang and Yaw–Sing Tang, "Time–Domain Study of Proximity–Effect Induced Transition Shifts," *IEEE Transactions on Magnetics*, vol. 27, No. 2, Mar. 1991, pp. 795–802.

K.B. Klaassen, "Magnetic Recording Channel Front–Ends," *IEEE Transactions on Magnetics*, vol. 27, No. 6, Nov. 1991, pp. 4503–4508.

John Hong, Roger Wood, David Chan, "An Experimental 180 Mb/sec PRML Channel for Magnetic Recording," *IEEE Transactions on Magnetics,* vol. 27, No. 6, Nov. 1991, pp. 4532–4537.

Jonathan D. Coker, Richard L. Galbraith, Gregory J. Kerwin, "Magnetic Characterization Using Elements of a PRML Channel," *IEEE Transactions on Magnetics,* vol. 27, No. 6, Nov. 1991, pp. 4544–4548.

L. Richard Carley and John G. Kenney, "Comparison of Computationally Efficient Forms of FDTS/DF Against PR4–ML," *IEEE Transactions on Magnetics,* vol. 27, No. 6, Nov. 1991, pp. 4567–4572.

Jaekyun Moon, "Discrete–Time Modeling of Transition –Noise–Dominant Channels and Study of Detection Performance," *IEEE Transactions on Magnetics,* vol. 27, No. 6, Nov. 1991, pp. 4573–4578.

Jack Keil Wolf, "A Survey of Codes for Partial Response Channels," *IEEE Transactions on Magnetics,* vol. 27, No. 6, Nov. 1991, pp. 4585–4589.

Norman L. Koren, "Matched Filter Limits and Code Performance in Digital Magnetic Recording," *IEEE Transactions on Magnetics,* vol. 27, No. 6, Nov. 1991, pp. 4594–4599.

H. M. Hilden, D.G. Howe, E.J. Weldon, Jr., "Shift Error Correcting Modulation Codes," *IEEE Transactions on Magnetics,* vol. 27, No. 6, Nov. 1991, pp. 4600–4605.

Derek D. Kumar and Bill J. Hunsinger, "ACT–enabled 100MHz Channel Equalizer," *IEEE Transactions on Magnetics,* vol. 27, No. 6, Nov. 1991, pp. 4799–4803.

Alan J. Armstrong and Jack Keil Wolf, "Performance Evaluation of a New Coding Scheme for the Peak Detecting Magnetic Recording Channel," *IEEE Transactions on Magnetics,* vol. 27, No. 6, Nov. 1991, pp. 4804–4806.

S. Raghavan and H.K. Thapar, "Feed–Forward Timing Recovery for Digital Magnetic Recording," *IEEE Transactions on Magnetics,* vol. 27, No. 6, Nov. 1991.

S. A. Raghavan and H.K. Thapar, "On Feed–Forward and Feedback Timing Recovery for Digital Magnetic Recording Systems," *IEEE Transactions on Magnetics,* vol. 27, No. 6, Nov. 1991, pp. 4810–4812.

James Fitzpatrick and Jack Keil Wolf, "A Maximum Likelihood Detector for Nonlinear Magnetic Recording," *IEEE Transactions on Magnetics,* vol. 27, No. 6, Nov. 1991, pp. 4816–4818.

John G. Kenney, Peter Alexis McEwen, L. Richard Carley, "Evaluation of Magnetic Recording Detection Schemes for Thin Film Media," *IEEE Transactions on Magnetics,* vol. 27, No. 6, Nov. 1991, pp. 4822–4824.

Pablo A Ziperovich, "Performance Degradation of PRML Channels Due to Nonlinear Distortions," *IEEE Transactions on Magnetics,* vol. 27, No. 6, Nov. 1991, pp. 4825–4827.

Jaekyun Moon and Jian–Gang Zhu, "Nonlinear Effects of Transition Broadening," *IEEE Transactions on Magnetics,* vol. 27, No. 6, Nov. 1991, pp. 4831–4833.

Jaekyun Moon, "Signal–to–Noise Ratio Degradation with Channel Mismatch," *IEEE Transactions on Magnetics,* vol. 27, No. 6, Nov. 1991, pp. 4837–4839.

R.D. Barndt, A.J. Armstrong, H.N. Bertram, J.K. Wolf, "A Simple Statistical Model of Partial Erasure in Thin Film Disk Recording Systems," *IEEE Transactions on Magnetics,* vol. 27, No. 6, Nov. 1991, pp. 4978–4980.

Y. Tang and C. Tsang, "A Technique for Measuring Nonlinear Bit Shift," *IEEE Transactions on Magnetics,* vol. 27, No. 6, Nov. 1991, pp. 5316–5318.

R.D. Barndt and J.K. Wolf, "Modeling and Signal Processing for the Nonlinear Thin Film Recording Channel," *IEEE Transactions on Magnetics,* vol. 28, No. 5, Sep. 1992, pp. 2710–2712.

H. Thapar, J. Rae, C. Shung, R. Karabed, P. Siegel, "On the Performance of a Rate 8/10 Matched Spectral Null Code for Class–4 Partial Response," *IEEE Transactions on Magnetics,* vol. 28, No. 5, Sep. 1992, pp. 2883–2888.

Hamid Shafiee and Jaekyun Moon, "Low–Complexity Viterbi Detection for a Family of Partial Response Systems," *IEEE Transactions on Magnetics,* vol. 28, No. 5, Sep. 1992, pp. 2892–2894.

Weining Zeng and Jaekyun Moon, "Modified Viterbi Algorithm for a Jitter–dominant $1-D^2$ Channel," *IEEE Transactions on Magnetics,* vol. 28, No. 5, Sep. 1992, pp. 2895–2897.

William E. Ryan, "Comparative Performance Between Drop–Out Detection and Viterbi Reliability Metric Erasure Flagging," *IEEE Transactions on Magnetics,* vol. 28, No. 5, Sep. 1992, pp. 2898–2900.

C. Menyennett, L. Botha, H.C. Ferreira, "A New Runlength Limited Code for Binary Asymmetric Channels," *IEEE Transactions on Magnetics,* vol. 28, No. 5, Sep. 1992, pp. 2901–2903.

Gang H. Lin, Rick Barndt, H. Neal Bertram, Jack K. Wolf, "Experimental Studies of Nonlinearities in High Density Disk Recording," *IEEE Transactions on Magnetics,* vol. 28, No. 5, Sep. 1992, pp. 3279–3281.

Ralph Simmons and Robert Davidson, "Media Design for User Density of up to 3 Bits Per Pulse Width," *IEEE Transactions on Magnetics,* vol. 29, No. 1, Jan. 1993, pp. 169–176.

Jaekyun Moon and Jian–Gang Zhu, "Nonlinearities in Thin –Film Media and Their Impact on Data Recovery," *IEEE Transactions on Magnetics,* vol. 29, No. 1, Jan. 1993, pp. 177–182.

R.D. Barndt, A.J. Armstrong, J.K. Wolf, "Media Selection for High Density Recording Channels," *IEEE Transactions on Magnetics,* vol. 29, No. 1, Jan. 1993, pp. 183–188.

Dean C. Palmer and Jonathan D. Coker, "Media Design Considerations for a PRML Channel," *IEEE Transactions on Magnetics,* vol. 29, No. 1, Jan. 1993, pp. 189–194.

Disk Drive Technology, Copyright © 1990 Zadian Software, Inc.

Lyle J. Fredrickson, "Viterbi Detection of Matched Spectral Null Codes for PR4 Systems," *IEEE Transactions on Magnetics,* vol. 28, No. 5, Sep. 1992.

K. Chopra, D.D. Woods, "A Maximum Likelihood Peak Detecting Channel," *IEEE Transactions on Magnetics,* vol. 27, No. 6, Nov. 1991, pp. 4819–4821.

Arvind M. Patel, "A New Digital Signal Processing Channel for Data Storage Products," *IEEE Transactions on Magnetics,* vol. 27, No. 6, Nov. 1991, pp. 4579–4584.

Richard C. Schneider, "Sequence (Viterbi–Equivalent) Decoding," *IEEE Transactions on Magnetics,* vol. 24, No. 6, Nov. 1988, pp. 2539–2541.

J.D. Coker, R.L. Galbraith, G.J. Kerwin, J.W. Rae, P.A. Ziperovich, "Implementation of PRML in a Rigid Disk Drive," *IEEE Transactions on Magnetics,* vol. 27, No. 6, Nov. 1991, pp. 4538–4543.

Roy D. Cideciyan, Francois Dolivo, Reto Hermann, Walter Hirt, Wolfgang Schott, "A PRML System for Digital Magnetic Recording," *IEEE Journal on Selected Areas in Communications,* vol. 10, No. 1, Jan. 1992, pp. 38–56.

* cited by examiner

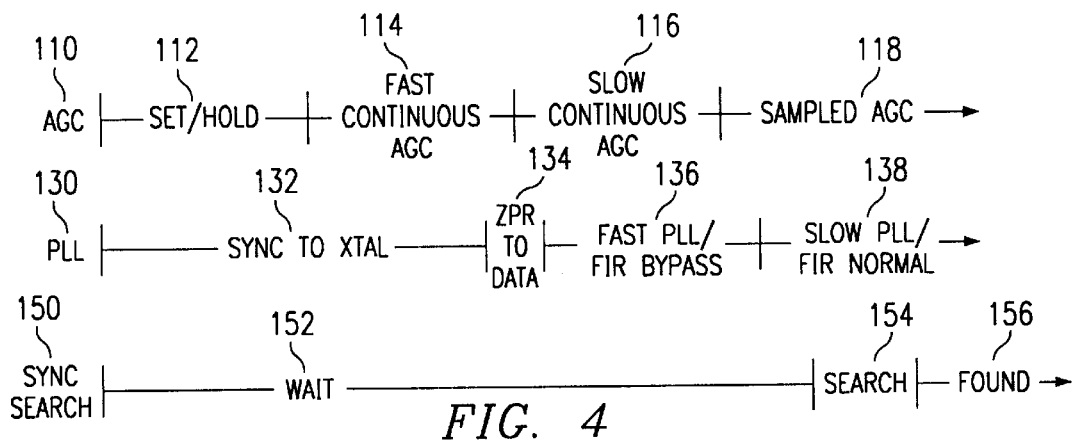
FIG. 4
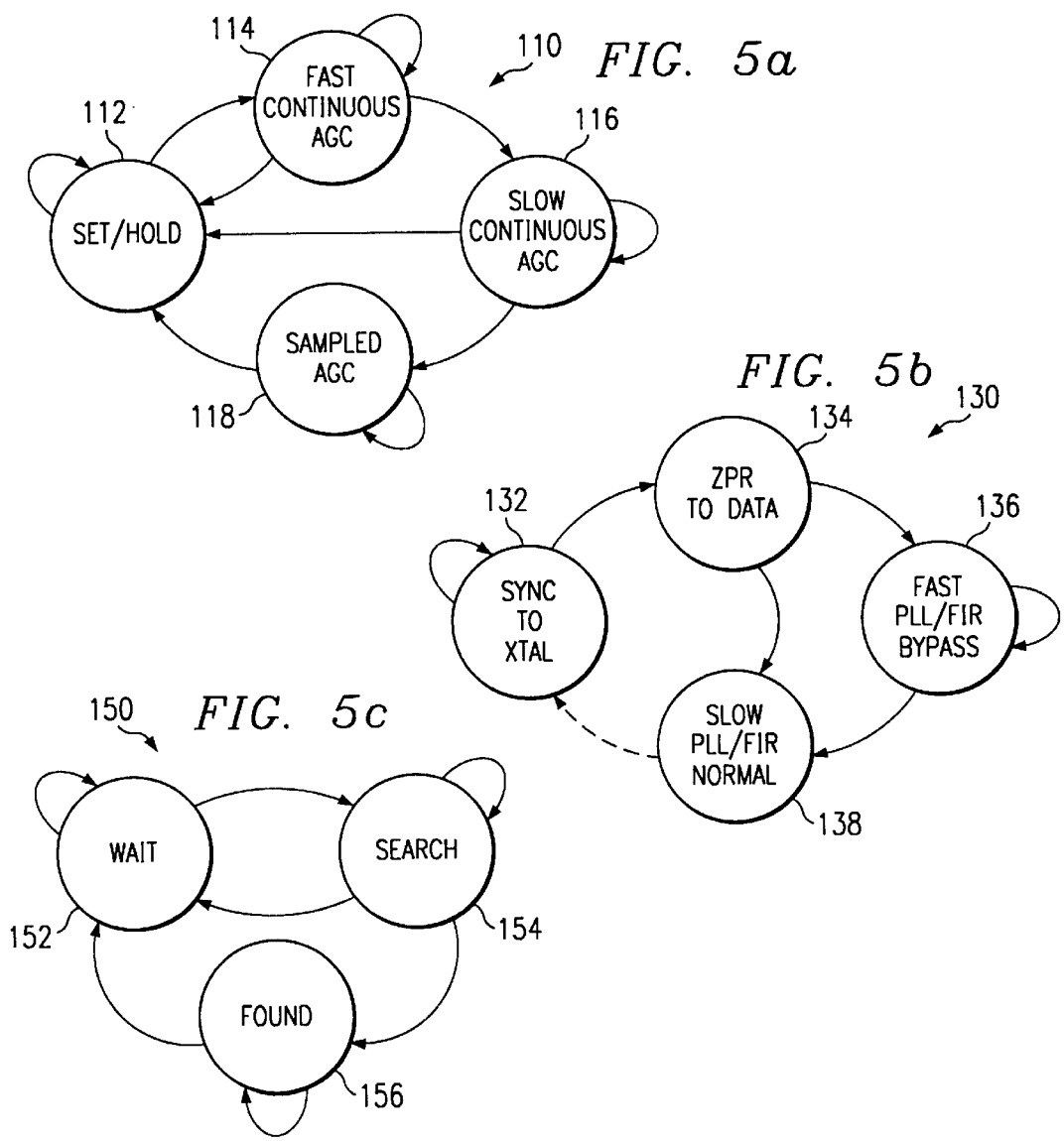
FIG. 5a
FIG. 5b
FIG. 5c

METHOD AND CIRCUITRY FOR ACQUIRING A SIGNAL IN A READ CHANNEL

TECHNICAL FIELD OF THE INVENTION

This invention relates in general to the field of information storage and more particularly to a method and circuitry for acquiring a signal in a read channel.

BACKGROUND OF THE INVENTION

As computer hardware and software technology continues to progress, the need for larger and faster mass storage devices for storing computer software and data continues to increase. Electronic databases and computer applications such as multimedia applications require large amounts of mass storage capacity, such as hard disk drive storage capacity.

To meet these ever increasing demands, hard disk drives (HDDs) continue to evolve and advance. Some of the early disk drives had a maximum storage capacity of five megabytes and used fourteen inch platters, whereas today's HDDs commonly have a storage capacity in the gigabyte range and use 3.5 inch platters. The increase in HDD storage capacity corresponds with increases in the amount of data stored per unit of area, or areal density. As such, HDD areal density has dramatically accelerated along with the increase in storage capacity. For example, in the 1980's, areal density increased about thirty percent per year, while in the 1990's annual areal density increases have been around sixty percent. Increases in areal density is important because the cost per megabyte of a HDD is inversely related to its areal density.

In general, mass storage devices and systems, such as HDDs, include a magnetic storage media, such as rotating disks or platters, a spindle motor, read/write heads, an actuator, a pre-amplifier, a read channel, a write channel, a servo circuit, and control circuitry to control the operation of the HDD and to properly interface the HDD to a host or system bus. The read channel, write channel, servo circuit, and memory may all be implemented as one integrated circuit that is referred to as a data channel. The control circuitry often includes a microprocessor for executing control programs or instructions during the operation of the HDD.

An HDD performs write, read, and servo operations when storing and retrieving data. These operations may occur in virtually any order. As the disk platters are moving, the read/write heads must align or stay on a desired track. This is accomplished by a servo operation using the servo circuit and the control circuitry. In a servo operation, a servo wedge is read from the disk. Generally, each sector includes a corresponding servo wedge. A sector generally has a fixed data storage capacity, such as 512 bytes of user data per sector. A servo wedge includes track identification information and track misregistration information, which may also be referred to as position error information. The position error information may be provided as servo bursts and may be used during both read and write operations to ensure that the read/write heads are properly aligned on a track. The track identification information is used during read and write operations so that a track may be properly identified. The servo circuit is used, while the disk platters are moving, to align the read/write heads with a desired track.

In a write operation, data is transferred from a host interface to its control circuitry. The control circuitry then stores the data in a local dynamic random access memory (DRAM). A control circuitry processor schedules a series of events to allow the data or information to be transferred to the disk platters through a write channel. The control circuitry, along with the servo circuit, moves the read/write heads to the appropriate track and locates the appropriate sector of the track. Finally, the control circuitry transfers the data from the DRAM to the located sector of the disk platter through the write channel. The write channel will encode the data so that the data can be more reliably retrieved later.

In a read operation, the appropriate sector to be read is located and data that has been previously written to the disk is read. A read operation may be needed after having just performed any other operation such as a write operation, a servo operation, or another read operation. Before reading actual user data, the read channel is prepared or conditioned to accurately acquire or read the data provided in the associated sector by performing various operations on fixed data provided in a preamble or header section. The read/write head senses the changes in the magnetic flux of the disk platter and generates a corresponding analog read signal. The read channel receives the analog read signal, processes the signal, and detects "zeros" and "ones" from the signal. The read channel processes the signal by amplifying the signal to an appropriate level using automatic gain control (AGC) techniques. The read channel then filters the signal, to eliminate unwanted high frequency noise, equalizes the channel, detects "zeros" and "ones" from the signal, and formats the binary data for the control circuitry. Any of a variety of techniques may be used for detecting "zeros" and "ones" such as peak detection techniques and partial response, maximum likelihood detection techniques, which are used in synchronously sampled read channels that often use a Viterbi detector for performing maximum likelihood detection. The binary or digital data stored in the sector is then transferred from the read channel to the control circuitry and is stored in the DRAM of the control circuitry. The processor then communicates to the host that data is ready to be transferred.

As mentioned above, before a read operation actually takes place, the read channel must be properly prepared or conditioned to accurately acquire a read signal which contains the user data stored in the sector to be read. In addition to containing user data, each sector contains a preamble section, also called a header section, that includes fixed data or a fixed signal that allows the read channel to prepare and condition itself to read user data stored in the corresponding sector. The preamble section is generally provided at each sector and may be provided at the first of a sector, at various points throughout a sector, or anywhere in a sector. This varies from manufacturer to manufacturer. The preamble section may include information used to perform such functions as AGC to prepare the read channel to acquire the read signal. For example, the preamble section may contain a series of magnetic transitions that allow the read channel to adjust its gain and sampling signal synchronization rate or clock so that the read channel can detect a synchronization field or byte and correctly acquire the read signal which contains the user data.

Overall HDD capacity suffers due to the presence of the preamble sections. Each byte dedicated to the preamble sections corresponds to a reduction in the overall HDD storage capacity available for storing user data or information.

SUMMARY OF THE INVENTION

From the foregoing it may be appreciated that a need has arisen for a method and circuitry for accurately acquiring a signal in a read channel that requires a smaller preamble section and hence increases overall HDD storage capacity. The present invention recognizes that the size of the preamble section is related to the length of time it takes for the read channel to acquire a read signal and, hence, provides a method and circuitry for acquiring a signal in a read channel in an expeditious manner. In accordance with the present invention, a method and circuitry for acquiring a signal in a read channel are provided which substantially eliminate the disadvantages and problems outlined above.

According to an aspect of the present invention, a method for acquiring a signal in a read channel having an equalizer includes performing an automatic gain control sequence; performing a phase locked loop sequence that includes performing a fast phase locked loop step, the fast phase locked loop step including bypassing the equalizer; and performing a synchronization search sequence.

The present invention provides various technical advantages. A technical advantage of the present invention includes increased overall HDD data capacity. Another technical advantage of the present invention includes fast automatic gain control and fast sampling signal generation to reduce the time required to acquire a signal in a read channel. Yet another technical advantage of the present invention includes the capability to acquire a signal in a minimal number of steps. Still yet another technical advantage of the present invention includes programmable circuitry that allows for the optimization or minimization of the time needed to prepare a read channel to acquire a read signal. These technical advantages may be attributed, at least in part, to a variety of alternative approaches for more rapidly acquiring a signal, such as, for example, a preamble signal according to the teachings of the invention as more particularly defined in the claims. Other technical advantages are readily apparent to one skilled in the art from the following figures, description, and claims.

BRIEF DESCRIPTION OF THE DRAWINGS

For a more complete understanding of the present invention and the advantages thereof, reference is now made to the following brief description, taken in connection with the accompanying drawings and detailed description, wherein like reference numerals represent like parts, in which:

FIG. 4 is a line chart illustrating various sequences and steps for a method for acquiring a signal in a read channel;

FIG. 5a is a state diagram illustrating steps of an automatic gain control sequence of the method of FIG. 4;

FIG. 5b is a state diagram illustrating steps of a phase locked loop sequence of the method of FIG. 4; and FIG. 5c is a state diagram illustrating steps of a synchronization search sequence of the method of FIG. 4.

DETAILED DESCRIPTION OF THE INVENTION

Figure 1:
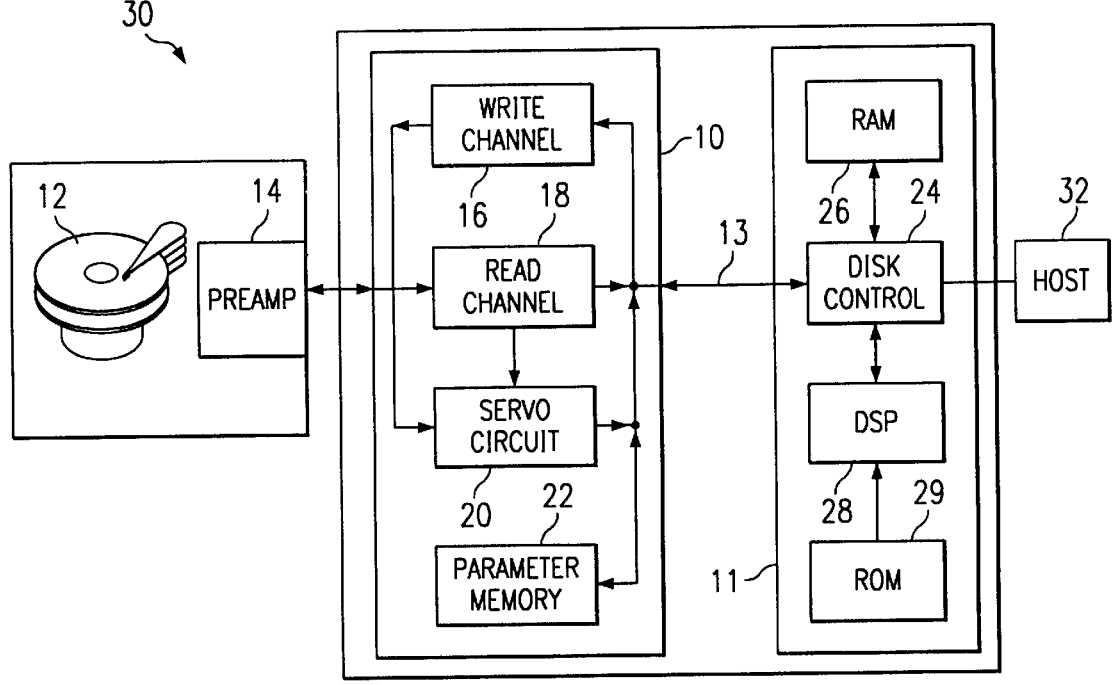
FIG. 1 is a block diagram illustrating a disk drive mass storage system.

FIG. 1 is a block diagram of a disk drive mass storage system 30 which is used for retrieving data during read operations and for storing data during write operations. Disk drive mass storage system 30 interfaces with a host 32 to exchange digital data during both read and write operations.

Disk drive mass storage system 30 includes a disk/head assembly 12, a preamplifier 14, a synchronously sampled data (SSD) channel 10, and a control circuitry 11. Disk/head assembly 12 and preamplifier 14 are used to magnetically store data. SSD channel 10 and control circuitry 11 are used to process data that is being exchanged with disk/head assembly 12 and to control the various operations of disk drive mass storage system 30. Host 32 exchanges digital data with disk drive mass storage system 30 through control circuitry 11.

Disk/head assembly 12 includes a number of rotating magnetic disks or platters used to store data that is represented as magnetic transitions on the magnetic platters. The read/write heads of disk/head assembly 12 are used to store and retrieve data from each side of the magnetic platters. The read/write heads may be any number of available read/write heads such as magneto-resistive heads. Preamplifier 14 interfaces between the read/write heads of disk/head assembly 12 and SSD channel 10 and provides amplification to the analog data signals as needed.

SSD channel 10 is used during read and write operations to exchange analog data signals with disk/head assembly 12 and to exchange digital data signals with control circuitry 11 through a data/parameter path 13. SSD channel 10 includes a write channel 16, a read channel 18, a servo circuit 20, and a parameter memory 22. SSD channel 10 may be implemented as a single integrated circuit or as multiple integrated circuits. One embodiment of read channel 18 is illustrated more fully in FIG. 2.

During write operations, write channel 16 receives digital data from control circuitry 11 in parallel format through data/parameter path 13. The digital data is encoded for storage and provided to disk/head assembly 12. Write channel 16 may include a register, a scrambler, an encoder, a precoder, a serializer, and a write precompensation circuit. The operation and timing of write channel 16 is controlled by a phase locked loop system.

Figure 2:
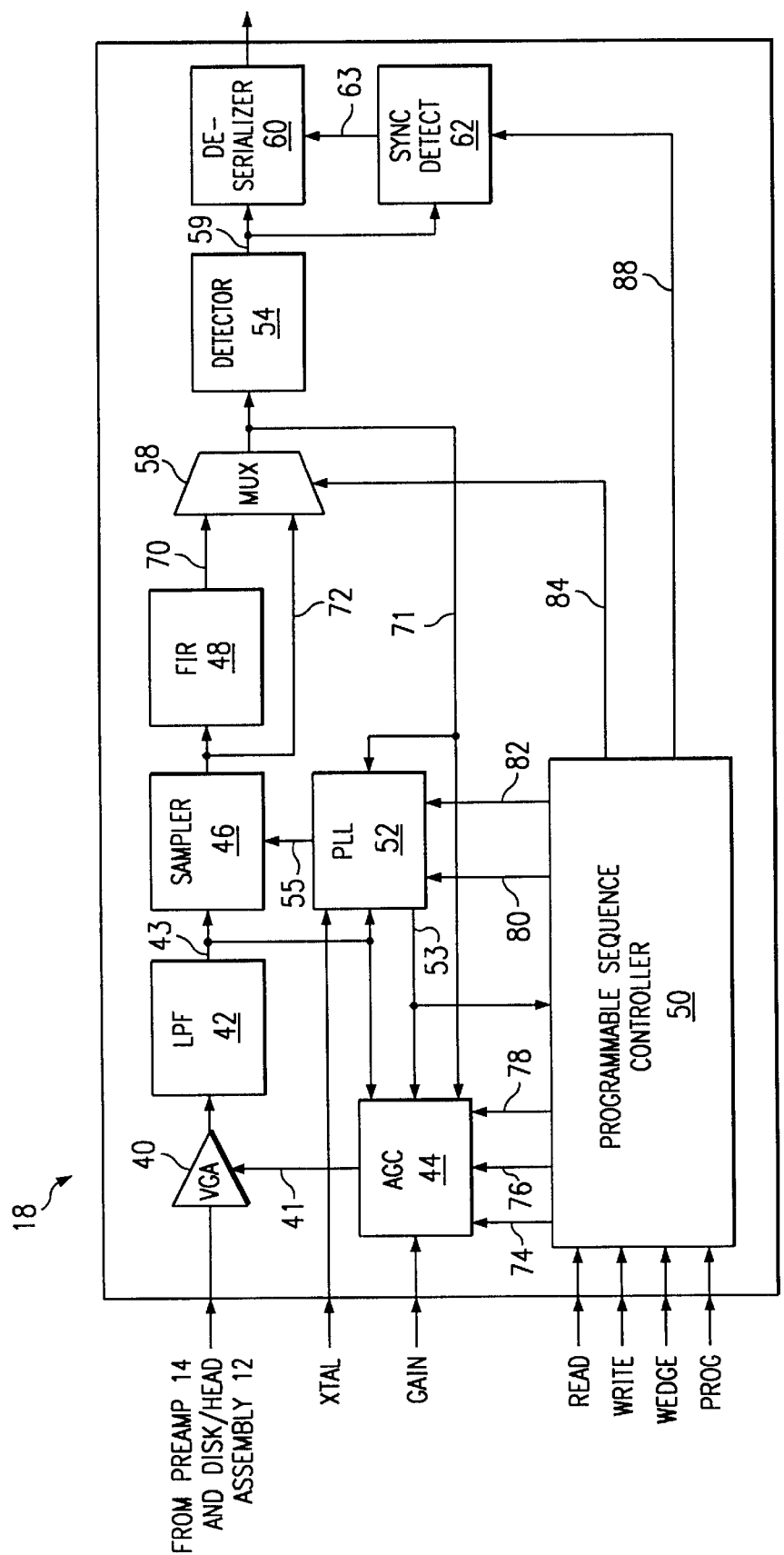
FIG. 2 is a block diagram illustrating a read channel of the disk drive mass storage system.

During read operations, read channel 18 receives analog data signals from disk/head assembly 12 through preamplifier 14. Read channel 18 conditions, detects, decodes, and formats the analog data signal and ultimately provides a corresponding digital data signal in parallel format to control circuitry 11 through data/parameter path 13. Read channel 18 includes a variety of circuit modules such as, for example, a variable gain amplifier; an automatic gain control circuit; a low pass filter; a sampler; an equalizer, such as a finite impulse response filter; a maximum likelihood, partial response detector; a sequence controller; a deserializer; and a synchronization field detection circuit. The timing and operation of read channel 18 is controlled by a phase locked loop system which is illustrated in FIG. 2.

Read channel 18, in one embodiment, includes a sequence controller to perform a sequence of operations that are used to acquire a read signal in preparation for reading the analog read signal during a read operation. These various sequences and steps are discussed more fully below and, according to the teachings of the invention, are used to minimize or optimize the time it takes to prepare read channel 18 to acquire the analog read signal.

The various circuit modules of SSD channel 10 may receive operational parameters for enhanced or optimal performance. The operational parameters are generally calculated during burn-in but may be calculated at other times. The operational parameters are used to enhance the operation of SSD channel 10. The operational parameters are also designed to account for the various physical and magnetic characteristics of disk drive mass storage system 30 that normally vary from system to system and influence operational performance. During start-up, the operational parameters are provided to SSD channel 10 from control circuitry 11 through data/parameter path 13. Parameter memory 22 stores the operational parameters. The various circuit modules of SSD channel 10 may then access the operational parameters from parameter memory 22.

Servo circuit 20 provides a position error signal and a track identification signal to control circuitry 11 during read and write operations. The position error signal relates to the relative alignment of the heads of disk/head assembly 12 so that the heads can be properly positioned during both read and write operations. The track identification signal allows a track to be identified so that the heads of disk/head assembly 12 may be properly positioned on the correct track.

Control circuitry 11 is used to control the various operations of disk drive mass storage system 30 and to exchange digital data with SSD channel 10 and host 32. Control circuitry 11 includes a microprocessor 28, which may be implemented as a digital signal processor (DSP), a disk control 24, a random-access memory (RAM) 26, and a read-only memory (ROM) 29. Microprocessor 28, disk control 24, RAM 26, and ROM 29 together provide control and logic functions to disk drive mass storage system 30 so that data may be received from host 32, stored, and later retrieved and provided back to host 32. ROM 29 stores preloaded microprocessor instructions for use by microprocessor 28 in operating and controlling disk drive mass storage system 30. ROM 29 may also store the operational parameters that are supplied to parameter memory 22 during start-up. RAM 26 is used for storing digital data for write operations and for storing digital data that has been generated as a result of a read operation. Disk control 24 includes various logic and bus arbitration circuitry used to properly interface disk drive mass storage system 30 to host 32 and for internally interfacing control circuitry 11 to SSD channel 10. Depending on the circuit implementation, any of a variety of circuitry may be used in disk control 24. Control circuitry 11 is also responsible for generating the various control and enable signals of disk drive mass storage system 30. For example, the READ, WRITE, and WEDGE enable signals are generated by control circuitry 11 and provided to the appropriate circuitry modules of SSD channel 10.

In operation, disk drive mass storage system 30 goes through an initialization or start-up routine when power is initially provided. One such routine instructs microprocessor 28 to communicate the operational parameters, previously stored in ROM 29, to parameter memory 22 through data/parameter path 13. The operational parameters are then stored in memory registers of parameter memory 22 for use by read channel 18 during a read operation.

After the initialization routine is complete, data may be read from or written to disk/head assembly 12. Servo circuit 20 provides information so that the read/write heads may be properly positioned and aligned on the tracks to read and write data. In general, the operation of disk drive mass storage system 30 may be divided into read operations and non-read operations. Read operations involve the reading of data from the disks of disk head assembly 12 and non-read operations include write operations, servo operations, and periods of time when the system is idle.

During a read operation, the read/write heads of disk/head assembly 12 are positioned and read channel 18 is prepared to receive an analog data or read signal from preamplifier 14. This may also be referred to as acquiring a signal and the methods for acquiring a signal are described more fully below. Read channel 18 receives the analog read signal from preamplifier 14, processes the analog read signal, and provides a corresponding digital data signal. This involves using various circuitry modules and techniques for synchronously sampling the analog read signal and detecting a digital signal. Read channel 18 provides the digital data signal to disk control 24 through data/parameter path 13. Disk control 24 provides various digital logic control and arbitration circuitry between SSD channel 10, host 32, RAM 26, microprocessor 28, and ROM 29 during both read and write operations. The digital data is then stored in RAM 26 until microprocessor 28 communicates to host 32 that the data is ready to be transferred. Host 32 may be a system bus such as the system bus of a personal computer.

During a write operation, a digital data signal is received from host 32 and ultimately stored on disk/head assembly 12. Digital data is initially provided from host 32 to control circuitry 11. Control circuitry 11 stores the digital data in RAM 26. Microprocessor 28 schedules a series of events so that the data may then be transferred from RAM 26 to disk/head assembly 12 through write channel 16. This data exchange occurs through data/parameter path 13. Write channel 16 encodes the digital data and places the data in serial format. Write channel 16 then provides the data to disk/head assembly 12 after the heads of disk/head assembly 12 have been properly positioned to write or store the data at an appropriate location on the disk.

FIG. 2 is a block diagram illustrating read channel 18 of disk drive mass storage system 30. According to the teachings of the invention, read channel 18 includes a variety of circuit modules used to quickly and efficiently acquire a signal from a preamble section so that an analog read signal may be synchronously sampled, processed, and conditioned during a read operation. Read channel 18 includes a variable gain amplifier (VGA) 40, an automatic gain control circuit (AGC) 44, a low pass filter (LPF) 42, a phase locked loop (PLL) 52, a sampler 46, a finite impulse response filter (FIR) 48, a multiplexer 58, a detector 54, a synchronization detection circuit (sync detect) 62, and a deserializer 60. All of these circuit modules are used during a read operation to condition and analyze the analog read signal to provide a corresponding digital data signal as an output.

Read channel 18, in the embodiment shown in FIG. 2, also includes a sequence controller 50. Sequence controller 50 is used to prepare read channel 18 to quickly and efficiently acquire the preamble signal to reduce the amount of hard disk drive capacity dedicated to the preamble section. As described above, the present invention recognizes that the size of the preamble section is related to the length of time it takes for the read channel to acquire a read signal and, hence, provides a method and circuitry for acquiring a signal in a read channel in an expeditious manner. As illustrated, sequence controller 50 provides timing and control signals to AGC 44, PLL 52, multiplexer 58, and sync detect 62 so that various sequences and steps for acquiring the preamble section are performed as desired. According to one aspect of the invention, sequence controller 50 is programmable, which enables generation of timing and control signals to effect efficient acquisition of the preamble signal based upon the particular application in which read channel 18 is utilized.

The operation of read channel 18 may be divided into two functions. The first function is the acquisition of a signal generated from a preamble section, and the second function is the processing of the analog read signal to detect data. The present invention is directed generally to the first function of acquiring a signal generated from a preamble section; however, it will prove beneficial to first describe the second function.

Before describing the second function of the operation of read channel 18, it should be noted that read channel 18 includes, generally, two automatic gain control loops, each with a corresponding loop response time. The first is a continuous-time control loop, and the second is the sampled-time control loop. The continuous-time control loop is used while performing the first function of acquiring a signal generated from a preamble section and includes the combination of VGA 40, LPF 42, and AGC 44. This control loop may operate in either a fast mode or a slow mode as determined by the timing and control signals provided from sequence controller 50. These are discussed more fully below. The sampled-time control loop is used while performing both the first function of acquiring a signal generated from a preamble section and the second function of processing of the analog read signal to detect data. The sampled-time control loop includes the combination of VGA 40, LPF 42, sampler 46, FIR 48, PLL 52, and AGC 44. The sampled-time control loop operates during the time that sampler 46 is sampling a filtered analog read signal provided by LPF 42. The use of both a continuous-time control loop and a sampled-time control loop decreases acquisition time of the preamble section because the use of a sampled-time automatic gain control loop adjusts the required gain to more accurate levels faster than the use of solely a continuous-time control loop.

Depending on the status of multiplexer 58, FIR 48 may or may not be included in the sampled-time control loop.

As described below, according to the invention, bypassing of FIR 48 during a portion of the operation of read channel 18 also decreases acquisition time of the preamble section because the FIR 48 is an unneeded delay element during acquisition of the preamble section. The preamble signal does not require equalization and therefore FIR 48 may be bypassed during acquisition of the preamble signal. AGC 44 uses the signal provided by multiplexer 58, along with a read clock signal from PLL 52 to generate an output gain signal that is provided to VGA 40. In alternative embodiments, AGC 44 may receive a programmable gain setting or signal, denoted as GAIN in FIG. 2.

The second function of read channel 18 includes the processing of the analog read signal to detect data during a read operation. This occurs after the analog read signal has been acquired, when the READ enable signal is provided in an enabled state, and the sampled-time control loop of read channel 18 operates to synchronously sample and process the analog read signal. As stated above, the sampled-time control loop includes the combination of VGA 40, LPF 42, sampler 46, FIR 48, PLL 52, and AGC 44. VGA 40 receives and amplifies an analog read signal received from disk/head assembly 12 through preamplifier 14 to generate an amplified analog read signal. VGA 40, along with AGC 44, work together to provide an appropriate amplification to the analog read signal. AGC 44 generates an output gain signal 41, which is provided to VGA 40, in response to receiving a read or PLL clock signal from PLL 52 and a reference signal 71 from multiplexer 58 so that appropriate adjustments can be made in the amplification or gain provided to the analog read signal by VGA 40. Reference signal 71 provided to AGC 44 through multiplexer 58 will generally be a discrete, equalized read signal 70 generated by FIR 48.

AGC 44 is provided as part of the sampled-time control loop and the continuous-time control loop and operates as part of either one or the other. AGC 44 generates output gain signal 41 in both cases and may be implemented using any of a variety of circuitry elements well known to one of ordinary skill in the art. For example, AGC 44 may receive threshold input signals and programmable gain settings and may include gain control circuits, amplifiers, various switches, filters such as a low pass filter, and control circuitry. The gain control circuits of AGC 44 may include rectifier circuits, adder circuits, and comparators.

The time required to generate output gain signal 41 is necessarily limited by the control loop response time of the control loop in which AGC 44 is functioning. This is a limiting factor on the speed in which the preamble signal can be acquired when AGC 44 functions as part of the continuous-time control loop. AGC 44 uses reference signal 71 provided by multiplexer 58, along with a read clock signal 53 from PLL 52 when functioning as part of the sampled-time control loop to generate an output gain signal that is provided to VGA 40. According to the invention, the use of a sampled-time control loop decreases the acquisition time. The bypassing of FIR 48 decreases the acquisition time because multiplexer 58 allows for a faster control loop bandwidth, and therefore allows for faster preamble acquisition.

The amplified analog read signal generated by VGA 40 is provided to LPF 42 for further processing. LPF 42 receives the amplified analog read signal and filters the signal to remove unwanted high frequency noise to generate a filtered analog read signal 43. LPF 42 also provides waveform shaping with amplitude boost. LPF 42 may be a continuous time 7th order filter designed using Gm/C components. The cutoff frequency and boost of LPF 42 may be programmable. Filtered analog read signal 43 is provided to sampler 46. As mentioned above, VGA 40, LPF 42, and AGC 44 form the continuous-time control loop which will be discussed more fully below in connection with the discussion of the acquisition of the signal generated from the preamble section.

Sampler 46 samples filtered analog read signal 43 and generates a discrete, analog read signal 72 having discrete values. Sampler 46 converts filtered analog read signal 43 from continuous-time to discrete-time. The filtered analog read signal is sampled synchronously at times that correspond to the various magnetic transitions stored on disk/head assembly 12. These magnetic transitions correspond to the data stored on disk/head assembly 12. Sampler 46 samples signal 43 and holds the value until the next sample occurs. PLL 52 generates a read clock signal 55 that controls when sampler 46 samples the filtered analog read signal. Each discrete value of discrete, analog read signal 72 corresponds to the value or-amplitude of filtered read signal 43 at the time the signal was sampled by sampler 46. Sampler 46 may be a sample and hold circuit, such as a circular sample and hold circuit, that is time sequence multiplexed to FIR 48 so that the correct time sequenced value is presented to FIR 48.

FIR 48 receives discrete, analog read signal 72 from sampler 46 and generates discrete, equalized read signal 70 having discrete levels corresponding to the magnetic transitions on disk/head assembly 12. FIR 48 equalizes or filters discrete, analog read signal 72 using a plurality of filter coefficients or taps. FIR 48 may also be referred to as an equalizer and may be implemented as an analog FIR. Discrete, analog read signal 72 is equalized to the target function of detector 54.

FIR 48 may be implemented using a plurality of multipliers. Each multiplier receives one of the plurality of filter coefficients and a consecutive discrete value of discrete, analog read signal 72. The outputs of each of the multipliers are then provided as inputs to an adder, such as an analog summer, which sums the inputs and generates discrete, equalized read signal 70. As discrete analog read signal 72 changes, the consecutive discrete values of discrete, analog read signal 72 that are provided to each multiplier are shifted to the next multiplier such that a new discrete value is now provided to the first multiplier and the oldest discrete value is dropped from the last multiplier.

FIR 48 may be implemented as a five tap filter with coefficients set by programmable digital circuitry. FIR 48 would then receive five digital coefficients or filter tap weights that are converted to an analog value through a digital-to-analog converter. Each coefficient is then provided to a separate multiplier. The outputs of all five of the multipliers are provided to an analog summer to provide discrete, equalized read signal 70. Although five coefficients or taps are described, the number of coefficients or taps and the corresponding number of multipliers may vary.

Multiplexer 58 receives discrete, analog read signal 72 from sampler 46 along with discrete, equalized read signal 70 from FIR 48. Multiplexer 58 provides one of these two signals as an input signal 71 to detector 54 depending upon the status of an FIR bypass enable signal 84 generated by sequence controller 50. FIR bypass enable signal 84 is described more fully below. Generally, FIR bypass enable signal 84 is provided in an enabled state when read channel 18 is preparing to acquire the analog read signal. Thus, during an actual read operation, FIR bypass enable signal 84 is not enabled which allows discrete, equalized read signal 70 to be provided to detector 54. Whenever FIR bypass enable signal 84 is provided in an enabled state, multiplexer 58 bypasses FIR 48 by providing discrete, analog read signal 72 to PLL 52, AGC 44, and detector 54.

According to the invention, this bypassing of FIR 48 allows for faster acquisition of the preamble signal because FIR 48 has some delay associated with its functions. During acquisition of the preamble signal FIR 48 may be bypassed because the preamble signal does not require equalization. Thus, acquisition of the preamble signal may occur faster, but without any detriment associated with bypassing FIR 48.

When detector 54 receives discrete, equalized read signal 70 from multiplexer 58, detector 54 analyzes the signal and generates a digital data output signal 59 corresponding to the data stored on disk/head assembly 12. In one embodiment, detector 54 may be a maximum likelihood detector or Viterbi decoder implementing the Viterbi algorithm. Assuming that detector 54 is implemented as a Viterbi decoder, detector 54 includes a metric circuit and a trellis circuit for analyzing the signal. The metric circuit receives discrete, equalized read signal 70 and performs an add, compare, and select function to determine whether a magnetic transition may or may not have occurred on the disk. The output of the metric circuit is provided to the trellis circuit which acts as a decision tree for sequence decoding. The trellis circuit generates digital data output signal 59, which serves as the output of detector 54.

Sync detect 62 receives digital data output signal 59 from detector 54 along with a start search enable signal 88 from sequence controller 50 as illustrated. As a consequence, sync detect 62 provides a synchronization detect signal 63 to deserializer 60. Sync detect 62 searches for the presence of a synchronization field or byte in the digital data output signal and enables the synchronization detect signal when a synchronization byte is detected. The synchronization field that is provided for each sector of data will generally be provided in the preamble section or immediately following the preamble section. However, the synchronization field or byte may be considered to be provided as part of the user data, separate from the preamble or header section. Nevertheless, sync detect 62 searches for the synchronization byte or field which indicates that user data will follow. Sync detect 62 may search for the synchronization byte over a predefined period or "window" of time that the synchronization byte should be present. Sync detect 62 may include a register for storing a predefined synchronization byte and digital logic circuitry to compare the digital data output to the predefined synchronization byte. The synchronization byte may be any length and may also be referred to as a synchronization signal.

Deserializer 60 receives digital data output signal 59 and the synchronization detect signal 63. Digital data output signal 59 is provided as an output in parallel format when the synchronization detect signal is enabled by sync detect 62. Deserializer 60 places digital data output signal 59 in an appropriate parallel format such as an eight or nine-bit format. Digital data output signal 59 may then be provided to host 32 through control circuitry 11 as illustrated in FIG. 1.

As mentioned above, PLL 52 generates the sampling clock signal that serves as read clock signal 55 for sampler 46 during read operations. During read operations, PLL 52 controls when sampler 46 samples filtered analog read signal 43 generated by LPF 42. PLL 52 receives reference signal 71, which is selectively either discrete, equalized read signal 70 or discrete analog real signal 72, as well as filtered analog read signal 43, a crystal clock signal (XTAL), and the READ enable signal. The READ enable signal and the XTAL signal may be provided to most or all of the various circuitry blocks of read channel 18 as needed. PLL 52 will generally include a voltage controlled oscillator, phase detector circuitry, and adder circuitry. PLL 52 may also include zero phase restart circuitry, which may be used to stop and restart the voltage controlled oscillator to minimize the phase difference between the output read clock signal and another signal, such as the XTAL signal. However, it should be understood the present invention is not limited to any one implementation of PLL 52.

Now that the second function of processing the analog read signal has been explained, the first function of acquiring a signal generated from a preamble section is explained below. The first function includes quickly and efficiently acquiring the signal generated from a preamble section. Read channel 18 may perform this function or method at virtually anytime such as before or after a write operation, a servo operation, or an idle period. In this manner, read channel 18 will be prepared to quickly and efficiently process user data if a read operation is requested next.

Generally, the sequences or steps for acquiring the signal generated from a preamble section may be broken down into three sequences, listed in FIG. 4, that include the following: (1) performing an automatic gain control sequence 110; (2) performing a phase locked loop (PLL) sequence 130; and (3) performing a synchronization (sync) search sequence 150. Each of these various sequences may include any number of steps that each occur for various lengths of time. For example, automatic gain control sequence 110 may include one or more of the following steps such as a set/hold step 112, a fast continuous AGC step 114, a slow continuous AGC step 116, and a sampled AGC step 118. PLL sequence 130 may include one or more of the steps of a sync to crystal step 132, a zero phase restart (ZPR) to data step 134, a fast PLL/FIR bypass step 136, and a slow PLL/FIR normal step 138. PLL sequence 130 will preferably include fast PLL/FIR bypass step 136. Similarly, sync search sequence 150 may include such steps as a wait step 152, a search step 154, and a found step 156. Each of the various steps of each of the various sequences are controlled by control signals generated by sequence controller 50. These steps and sequences are illustrated in FIGS. 4 and 5 and are described more fully below.

Figure 3:
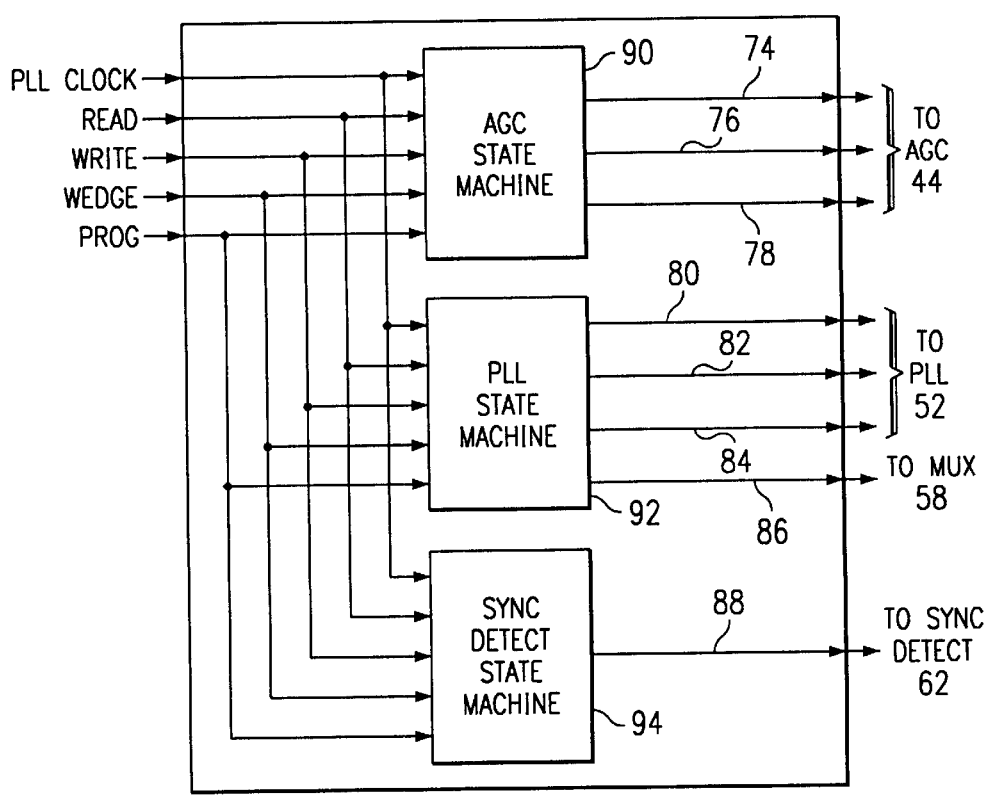
FIG. 3 is a block diagram illustrating a sequence controller of the read channel.

Sequence controller 50, illustrated in FIGS. 2 and 3, generates an AGC fast/slow enable signal 74, a continuous/sampled time enable signal 76, and a set/hold enable signal 78 to control the various steps of automatic gain control sequence 110. With reference to FIG. 4, automatic gain control sequence 110 first uses AGC 44 in the continuous-time control loop to generate or set an output gain signal and then to hold this gain signal to perform set/hold step 112. This is accomplished when sequence controller 50 enables set/hold enable signal 78 for a desired period of time.

Next, fast continuous AGC step 114 of automatic gain control sequence 110 is performed when AGC 44 quickly estimates and generates output gain signal 41 at a level corresponding to the steady state output gain level while AGC 44 is operating as part of the continuous-time control loop. Alternatively, a programmed output gain signal may be used during fast continuous AGC step 114. As a result, VGA 40 receives the preamble signal as an analog preamble signal and quickly amplifies the signal as determined by output gain signal 41 of AGC 44 to generate an amplified analog preamble signal in response. LPF 42 filters the amplified analog preamble signal and generates filtered analog preamble signal 43. AGC 44 then receives filtered analog preamble signal 43 as a feedback signal and adjusts the output gain signal accordingly. Preferably, AGC 44 estimates and generates output gain signal 41 at a rate that is faster than the response time of the continuous-time control loop. In this manner, the gain of the amplified analog preamble signal is quickly increased without having to slowing ramp up to the desired value. Although some overshoot or undershoot may occur, critical time is saved by quickly moving in the desired direction without having to wait for the response time of the continuous-time control loop to make adjustments. Fast continuous AGC step 114 is accomplished when sequence controller 50 enables AGC fast/slow enable signal 74 and continuous/sampled time enable signal 76 to reflect that fast continuous AGC step 114 is desired.

After performing fast continuous AGC step 114, automatic gain control sequence 110 includes slow continuous AGC step 116. Slow continuous AGC step 116 takes over the operation of AGC 44 in the continuous-time control loop and more slowly adjusts the output gain signal of AGC 44 at a rate that is preferably slower than the response time of the continuous-time control loop. Amplified analog preamble signal 43 serves as a reference signal to AGC 44 when generating output gain signal 41. Alternatively, a programmed output gain signal may be used during slow continuous AGC step 116. In this manner, the gain of the amplified analog preamble signal is more slowly adjusted and should already be near the desired final value. Slow continuous AGC step 116 is accomplished when sequence controller 50 enables AGC fast/slow enable signal 74 and continuous/sampled time enable signal 76 to reflect that slow continuous AGC step 114 is desired.

The final step in automatic gain control sequence 110 includes sampled AGC step 118. Sampled AGC step 118 includes implementing the sampled-time control loop and generating output gain signal 41 as described previously. Generally, AGC 44 will receive discrete, equalized read signal 70, as reference signal 71, through multiplexer 58 and will generate the output gain signal based on this reference signal. Sampled AGC step 118 is accomplished when sequence controller 50 enables continuous/sampled time enable signal 76 to reflect that AGC 44 should operate as part of the sampled-time control loop.

Sequence controller 50 also generates a sync to crystal enable signal 80, a zero phase restart (ZPR) enable signal 82, and an FIR bypass enable signal 84 to control the various steps of the PLL sequence 130. Sync to crystal step 132 is the first step of the PLL sequence 130. Sync to crystal step 132 involves PLL 52 synchronizing the PLL or read clock signal 55 to the XTAL signal, shown provided to PLL 52 in FIG. 2. Sync to crystal step 132 is accomplished when sequence controller 50 enables sync to crystal enable signal 80.

Next, according to the teachings of the invention, PLL sequence 130 includes zero phase restart (ZPR) to data step 134. ZPR to data step 134, preferably, occurs around the time automatic gain control sequence 110 transitions from fast continuous AGC step 114 to slow continuous AGC step 116. ZPR to data step 134 involves restarting the PLL or read clock signal 55 to minimize or eliminate the phase difference between the PLL or read clock signal 55 and the data signal. The data signal will generally be the preamble signal. ZPR to data step 134 is accomplished when sequence controller 50 enables ZPR enable signal 82. ZPR to data step 134 eliminates a time delay conventionally associated with reducing phase error between read clock signal 55 and the data signal, and therefore allows for more efficient acquisition of the preamble signal.

After performing ZPR to data step 132, PLL sequence 130 includes fast PLL/FIR bypass step 136. Fast PLL/FIR bypass step 136 includes bypassing FIR 48, which may also be referred to as an equalizer and may be implemented as a series of delays, to speed up the loop response time of the sampled-time control loop. The faster loop response time allows PLL 52 to much more quickly generate a correct or near correct PLL or read clock signal in preparation for reading data and therefore allows quicker acquisition of the preamble signal. Fast PLL/FIR bypass step 136 is accomplished when sequence controller 50 enables FIR bypass enable signal 84 so that multiplexer 58 provides discrete, analog preamble signal 72 which effectively eliminates FIR 48 from the sampled-time control loop. The final step in PLL sequence 130 includes slow PLL/FIR normal step 138 in which FIR 48 is provided back into the sampled-time control loop. Slow PLL/FIR normal step 138 is accomplished when sequence controller 50 unenables FIR bypass enable signal 84 so that FIR 48 is not bypassed. This is accomplished by controlling multiplexer 58 to provide discrete, equalized preamble signal 70. Note that in this paragraph, discrete, equalized read signal 70 and discrete, analog read signal 72 have been reworded such that the word "read" has been replaced with the word "preamble" to highlight the fact that we are still acquiring the preamble signal. However, it should be noted that slow PLL/FIR normal step 138 may be performed after the preamble signal has been acquired and an actual read signal is being generated. In such a case, the proper terminology would be discrete, equalized read signal 70.

Sequence controller 50 generates a start search enable signal 88 to control sync search sequence 150. Once the synchronization byte is found, sync detect 62 generates the synchronization detect signal in an enabled state. Synch search sequence 150 includes such steps as wait step 152, search step 154, and found step 156. Sync search sequence performs wait step 152 when start search enable signal 88 is provided in an unenabled state and the preamble signal is still being processed by read channel 18. Once user data is about to be provided, sequence controller 50 generates start search enable signal 88 in an enabled state and sync search sequence 150 performs search step 154 by having sync detect 62 of read channel 18 search for a synchronization byte or the like that indicates that user data is about to follow. Once user data is found, sync detect 62 generates the synchronization detect signal in an enabled state as discussed above. This signifies found state 154 of sync search sequence 150.

FIG. 3 is a block diagram illustrating one embodiment of sequence controller 50 of read channel 18 for generating the various control signals discussed above. Sequence controller 50 includes an AGC state machine 90, a PLL state machine 92, and a sync detect state machine 94. Each of these state machines receives the PLL or read clock signal, the READ, WRITE, and WEDGE enable signals, and a programming enable signal (PROG) and generates the various control signals in response. These various control signals are used to enable and control the various sequences and steps in read channel 18 so that the preamble signal may be acquired quickly and efficiently. Such sequences and methods may include performing the automatic gain control sequence, the phase locked loop sequence, and the synchronization search sequence. It should be understood that the various steps of the automatic gain control sequence, the phase locked loop sequence, and the synchronization search sequence may be performed simultaneously or in a variety of different lengths of time without departing from the scope of the present invention. It should also be understood that the relative timing of and between the various steps controlled by sequence controller 50 may be varied and may be programmably changed using the programming enable signal (PROG) and a data port (not shown in the FIGURES). Such programmability allows use of read channel 18 in a variety of hard disk drive applications, while at the same time allowing tailoring of the relative timing of and between the steps to optimize preamble acquisition based on the specific application.

AGC state machine 90 generates AGC fast/slow enable signal 74, continuous/sampled time enable signal 76, and set/hold enable signal 78. PLL state machine 92 generates sync to crystal enable signal 80, ZPR enable signal 82, and FIR bypass enable signal 84, while sync detect state machine 94 generates start search enable signal 88. In a preferred embodiment, each of these state machines will generally include programmable timer circuits and the like to generate each of these signals.

FIG. 4 is a line chart illustrating the various sequences and steps for the method for acquiring the preamble signal in a read channel as discussed above with respect to FIG. 2. Automatic gain control sequence 110 may include set/hold step 112, fast continuous AGC step 114, slow continuous AGC step 116, and sampled AGC step 118. Similarly, PLL sequence 130 may include sync to crystal step 132, ZPR to data step 134, fast PLL/FIR bypass step 136, and slow PLL/FIR normal 138. Finally, sync search sequence 150 may include wait step 152, search step 154, and found step 156.

FIG. 5a is a state diagram illustrating the steps of automatic gain control sequence 110 of the method of FIG. 4. First, the state of performing set/hold step 112 is illustrated in which set/hold step 112 may be performed again or the sequence may proceed to fast continuous AGC step 114. Next, the state of performing fast continuous AGC step 114 is illustrated in which fast continuous AGC step 114 may be performed again or the sequence may return to set/hold step 112 or proceed to slow continuous AGC step 116 is performed. Next, the state of performing slow continuous AGC step 116 is illustrated where slow continuous AGC step 116 may be performed again or the sequence may return to set/hold step 112 or proceed to sampled AGC step 118. Finally, FIG. 5a illustrates the state of performing sampled AGC step 118 in which sampled AGC step 118 may be performed again or the sequence may proceed back to set/hold step 112.

FIG. 5b is a state diagram illustrating the steps of a PLL sequence 130 of the method of FIG. 4. Initially, the state of performing sync to crystal step 132 is illustrated in which sync to crystal step 132 may be performed again or PLL sequence 130 may proceed to ZPR to data step 134. Next, the state of performing ZPR to data step 134 is illustrated in which the sequence may proceed to either fast PLL/FIR bypass step 136 or slow PLL/FIR normal 138. Next, FIG. 5b illustrates the state of performing fast PLL/FIR bypass step 136 in which fast PLL/FIR bypass step 136 may be performed again or slow PLL/FIR normal 138 may be performed next. Finally, the state of performing slow PLL/FIR normal 138 is illustrated and a dotted arrow is shown extending from the state of performing slow PLL/FIR normal 138 to the state of performing sync to crystal step 132. The dotted arrow signifies that other states or steps not illustrated herein may be provided between these two steps.

FIG. 5c is a state diagram illustrating the steps of a sync search sequence 150 of the method of FIG. 4. Initially, the state of performing wait step 152 is illustrated in which wait step 152 may be performed again or the sequence may proceed to search step 154. Next, the state of performing search step 154 is illustrated in which search step 154 may be performed again, the sequence may proceed back to wait step 152 or it may proceed to found step 156. Finally, the state of performing found step 156 is illustrated in which found state 156 may be performed again or the sequence may proceed to wait step 152.

Thus, it is apparent that there has been provided, in accordance with the present invention, a method and circuitry for acquiring a signal in a read channel that satisfies the advantages set forth above. Although the present invention has been described in detail, it should be understood that a multiplicity of changes, substitutions, and alterations can be made herein without departing from the scope of the present invention. For example, a variety of different techniques and alternative circuitry may be used in a read channel of a mass storage system to process a data signal during a read operation yet the present invention may be used to prepare virtually any read channel to acquire a data or read signal. Also, the direct connections illustrated herein could be altered by one skilled in the art such that two devices are merely coupled to one another through an intermediate device or devices without being directly connected while still achieving the desired results demonstrated by the present invention. Other examples of changes, substitutions, and alterations are readily ascertainable by one skilled in the art and could be made without departing from the spirit and scope of the present invention as defined by the following claims.

What is claimed is:

1. A method for acquiring a signal in a read channel, the read channel having an equalizer, the method comprising the steps of:

performing an automatic gain control sequence;

performing a phase locked loop sequence that includes performing a fast phase locked loop step, the fast phase locked loop step including bypassing the equalizer; and performing a synchronization search sequence.

2. The method of claim 1, wherein performing a phase locked loop sequence further includes performing a slow phase locked loop step.

3. The method of claim 1, wherein bypassing the equalizer comprises bypassing an analog finite impulse response filter.

4. The method of claim 1, wherein performing an automatic gain control sequence includes:

setting and holding the gain applied to the signal;

performing a fast continuous automatic gain control step; and performing a slow continuous automatic gain control step.

5. The method of claim 1, wherein the signal includes a preamble section.

6. The method of claim 1, wherein performing a phase locked loop sequence includes:

synchronizing to a crystal clock;

performing a zero phase restart to the signal; and performing a slow phase locked loop step after performing a test phase locked loop step.

7. A method for acquiring a signal in a read channel, the method comprising the steps of:

performing an automatic gain control sequence, the automatic gain control sequence including performing a continuous automatic control step and a sampled automatic gain control step;

performing a phase locked loop sequence; and performing a synchronization search sequence.

8. The method of claim 7, wherein performing a phase locked loop sequence includes:

synchronizing to a crystal clock;

performing a zero phase restart to the signal; and performing a slow phase locked loop step after the performing a fast phase locked loop step.

9. The method of claim 7, wherein performing a phase locked loop sequence includes performing a test phase locked loop step that includes bypassing an equalizer in the read channel.

10. The method of claim 9, wherein the equalizer is an analog finite impulse response filter.

11. The method of claim 7, wherein the signal includes a preamble section.

12. A method for acquiring a signal in a read channel comprising the steps of:

performing an automatic gain control sequence;

performing a phase locked loop sequence, the phase locked loop sequence including performing a zero phase restart to the signal;

performing a synchronization search sequence, wherein using an equalizer in the read channel includes using a finite impulse response equalizer, wherein performing a phase locked loop sequence further comprises:

synchronizing to a crystal clock; and performing a slow phase locked loop step after performing a fast phase locked loop step.

13. A method for acquiring a signal in a read channel comprising the steps of:

performing an automatic gain control sequence;

performing a phase locked loop sequence, the phase locked loop sequence including performing a zero phase restart to the signal;

performing a synchronization search sequence, wherein using an equalizer in the read channel includes using a finite impulse response equalizer, wherein:

performing an automatic gain control sequence that includes the steps of:

setting and holding the gain applied to the signal;

performing a fast continuous automatic gain control step;

performing a slow continuous automatic gain control step;

performing a sampled automatic gain control step;

performing a synchronization search sequence that includes the steps of;

performing a wait step;

performing a search step; and performing a found step.

14. A read channel, including circuitry for acquiring a signal in a read channel, comprising:

a sequence controller operable to generate an automatic gain control fast/slow enable signal;

an automatic gain control circuit operable to generate an output gain signal, the automatic gain control circuit responsive to the automatic gain control fast/slow enable signal to perform either a fast continuous automatic gain control step or a slow continuous automatic gain control step;

a variable gain amplifier responsive to the output gain signal and operable to amplify an analog read signal by an amount related to the output gain signal to generate an amplified analog read signal;

a continuous-time filter operable to filter the amplified analog read signal to generate a filtered read signal;

an equalizer;

a selection circuit;

a sampler operable to sample the filtered read signal in response to receiving a read clock signal and operable to generate and selectively provide a discrete, analog read signal to either the equalizer or to the selection circuit;

the equalizer selectively operable to filter the discrete analog read signal to generate a discrete, equalized read signal;

the selection circuit operable to provide either the discrete analog read signal or the discrete, equalized read signal as a reference signal;

a phase locked loop circuit operable to receive a clock signal and the reference signal and to generate the read clock signal in response; and a detector operable to analyze the discrete, equalized read signal to generate a digital data output signal.

15. The read channel of claim 14, wherein the sequence controller is further operable to generate a bypass enable signal and the selection circuit is responsive to the bypass enable signal to provide the discrete, analog read signal as the reference signal.

16. The read channel of claim 14, wherein the sequence controller includes a plurality of state machines.

17. The read channel of claim 14, wherein the sequence controller is further operable to receive at least one input signal to control generation of the automatic gain control fast/slow enable signal.

* * * * *